United States Patent [19]

MacDonald et al.

[11] Patent Number: 4,696,059
[45] Date of Patent: Sep. 22, 1987

[54] REFLEX OPTOELECTRONIC SWITCHING MATRIX

[75] Inventors: R. I. MacDonald; D. K. W. Lam, both of Ottawa; R. W. Jenkins, Almonte, all of Canada

[73] Assignee: Canadian Patents and Development Limited-Societe Canadienne des Brevets et D'Exploitation Limitee, Ottawa, Canada

[21] Appl. No.: 586,777

[22] Filed: Mar. 7, 1984

[51] Int. Cl.[4] ............................................... H04B 9/00
[52] U.S. Cl. .................................. 455/600; 350/96.13; 350/96.14; 455/612
[58] Field of Search .................. 455/600, 607, 612; 340/825.79, 825.80, 825.81, 825.82; 350/96.14, 96.13

[56] References Cited

U.S. PATENT DOCUMENTS

| | | | |
|---|---|---|---|
| 4,126,836 | 11/1978 | Carnes et al. | 333/165 |
| 4,201,442 | 5/1980 | McMahon et al. | 350/96.14 |
| 4,492,425 | 1/1985 | Kersten et al. | 350/96.14 |

Primary Examiner—Joseph A. Orsino, Jr.
Attorney, Agent, or Firm—Pascal & Associates

[57] ABSTRACT

An optoelectronic switching matrix which can be configured to form a variety of signal processing elements, such as a digital switched filter, a digital word generator, a programmable bandpass filter, programmable delay, etc. Optical or electronic delay apparatus is connected between output and input ports of the matrix, and can be switched to provide delays or resonant loops. A versatile signal translation element is thus realized.

63 Claims, 6 Drawing Figures

REFLEX OPTOELECTRONIC SWITCHING MATRIX

BACKGROUND TO THE INVENTION

This invention relates to optoelectronic switching apparatus and in particular an optoelectronic switching matrix which can be used to form a variety of signal processing elements.

Broadband signal processing, particularly of signals having frequencies higher than 100 MHz requires the use of elements or components which have not, to a large extent, yet been satisfactorily realized. The present invention is an apparatus which, in different embodiments, can provide programmable signal delay, programmable bandpass filtering, digital parallel to serial conversion at high data rate, digital matched filtering, and programmable high rate digital word generation, for example. The invention depends on the provision of an optoelectronic switching matrix, which has high isolation between optical waveguide signal paths, wideband and signal summation, and unidirectional cross points.

In the past, bandpass filters have been constructed from tapped delay lines, but the length of the delay lines has been difficult to vary dynamically. Techniques for achieving varying delays with lengths of transmission line to cover a broad frequency range have been difficult to utilize. Consequently in the past, easily realizable circuit elements have not become available for use with wideband signals in excess of 100 MHz.

Such circuit elements are readily and easily achievable in the invention described below. One of the important elements of the inventive combination is an optoelectronic switching matrix. The characteristics of the elements can be easily varied by the programmed operation of the switching matrix.

SUMMARY OF THE INVENTION

In general, the preferred embodiment of the invention is a signal processor comprising an optoelectronic switching matrix having at least first and second input ports and at least first and second output ports, and an array of switched crosspoints interconnecting the ports, a circuit for receiving an input signal at the first input port, a first signal delay apparatus connected between the first output port and the second input port, the matrix including apparatus for selectively switching the first input port to the second output port to provide a representation of the input signal thereat, or to the first output port and switching the second input port to the second output port to provide a delayed representation of the input signal thereof.

Of course several output ports and several input ports can be used with several different delay apparatus. The result is a delay line element having selectable delay.

Each delay apparatus can be switched via the matrix back to itself, thus providing a resonant loop. One or a plurality of such loops can be used to realize a filter.

In addition, a single pulse can be received at the input port. The various delay routes can be configured by switching the matrix in a predetermined manner whereby a plurality of pulses is obtained at the output port, due to the input pulse being passed to various delays and the variously delayed resultant pulses arriving in sequence at the output port. Consequently digital words can be generated based on a programmed operation of the matrix. It should be noted that the characteristics of the digital word are based on the operational characteristics of the switching matrix, and not on the characteristics of the programming apparatus, which can operate at much slower speeds, since only the switching crosspoints must be operated, rather than a pulse generator.

In a similar manner, comb filters, digital parallel to serial converters, matched filters, etc. can be realized, as will be described below.

BRIEF INTRODUCTION TO THE DRAWINGS

A better understanding of the invention will be obtained by reference to the detailed description below, with reference to the following drawings, in which.

DESCRIPTION OF THE PREFERRED EMBODIMENT

Fundamentally a switching matrix consists of a plurality of input ports, any of which can be switched to any of a plurality of output ports. The switchable connections between the input and output ports are referred to as crosspoints.

Figure 1:
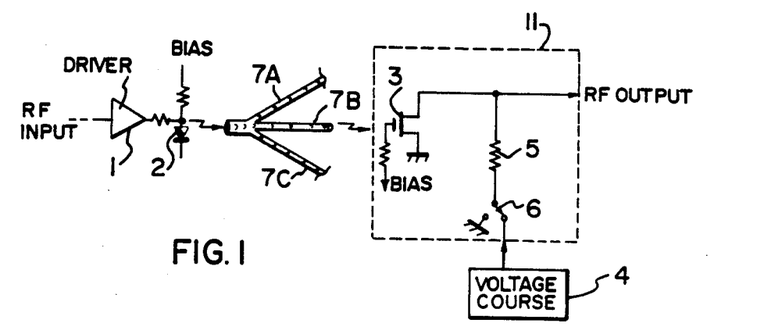
FIG. 1 illustrates a representative input port and crosspoint switch which can be used to form a matrix in the present invention.

FIG. 1 shows a representative input port and single switching crosspoint which is based on an optoelectronic semiconductor switch described in U.S. Pat. No. 4,369,371 issued Jan. 18th, 1983, invented by E. H. Hara, R. I. MacDonald, R. S. H. Hum and B. S. Kawasaki. In that invention, a high bandwidth signal is applied to an input designated as RF INPUT, which is applied to the input of driver 1, the output of which is applied to a light emitting source 2 such as an appropriately biased light-emitting diode, semiconductor laser, etc.

The modulated light emitted from light source 2 impinges on a photosensor 3 via a lens system or optical fiber waveguide 7B. The photosensor (shown as a broadband photoconductive detector having a photoconductive channel) is connected to a source of bias, and an RF output signal is received from its terminals.

Its terminals are connected to a voltage source 4 through a load 5, via a switch 6, one terminal of which is connected to ground. When the switch 6 connects the load 5 to ground, resulting in a low voltage across the source and drain terminals of the photoconductor, the photoconductor is "off". When switch 6 connects the load 5 to voltage source 4, the source-drain voltage increases, resulting in the RF output signal being produced on receipt of the RF modulated light from light source 2.

In order to produce a switching matrix, the light from light source 2 is split into as many optical waveguide branches as there are output ports. For example, where there are three output ports, there will be three waveguide branches. The branched waveguide thus forms an optical power divider, having branches 7A, 7B and 7C.

The output of each of the branches terminates in a photosensor circuit as described above.

It should be noted that each of the switches 6 in the operation circuits for the multiplicity of photosensors 3 would typically be formed of an FET switch operated, for example, from a microprocessor.

Figure 2:
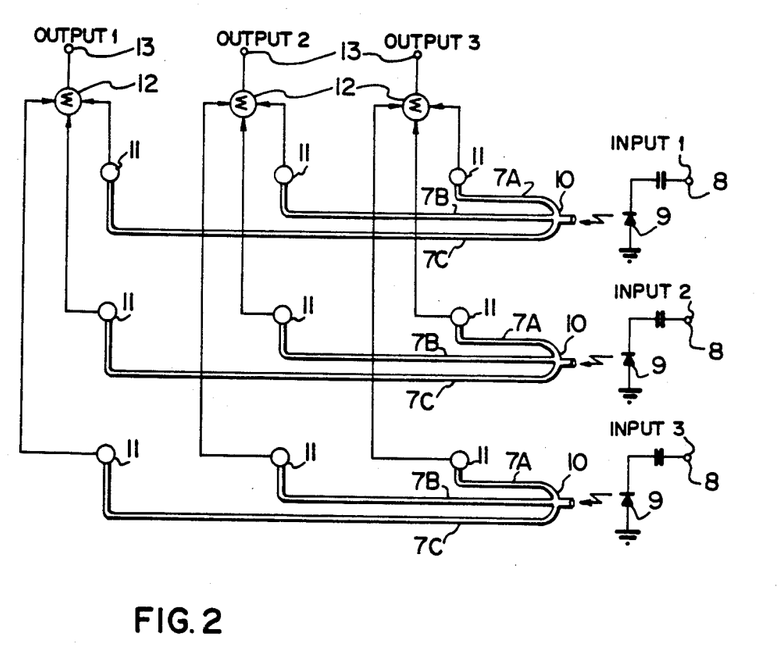
FIG. 2 is a represenpation of an optoelectronic switching matrix.

FIG. 2 illustrates an array of crosspoints forming a three input by three output (3 by 3) optoelectronic switching matrix. The input port terminals 8 are coupled to light emitting diodes 9 which emit light into the input of optical power dividers 10. The dividers split the input light received from the light emitting diodes into three branches 7A, 7B and 7C.

The branches of each optical power divider are equal in length, according to the preferred embodiment. However in another embodiment as will be described below, they can be of different lengths in order to themselves form delay lines. The branches of the optical power dividers preferably are optical wave guides, e.g. formed of glass fibers.

The ends of each of the branches of each optical power divider is connected to a photosensor arrangement 11 as described with reference to FIG. 1. The outputs of one photosensor arrangement related to each input are connected to corresponding summers 12, one summer being associated with each output port 13.

In operation, therefore, with a signal being applied to any input port 8, a corresponding modulated light signal passes through the optical power divider and appears at photosensor arrangements 11 by switching the voltage source 4 (FIG. 1) via switch 6. In any of the photosensor arrangements, the input signal applied to any input port 8 can be switched to an output port 13. Furthermore, should there be signals at more than one of the input ports 8, the power divided signal resulting therefrom will add in the summer 12 associated with the switched photosensor arrangements thus resulting in a summed signal at the associated output port.

It should also be noted that the light-emitting diode - photosensor coupling arrangements are unidirectional from input to output port.

Figure 3:
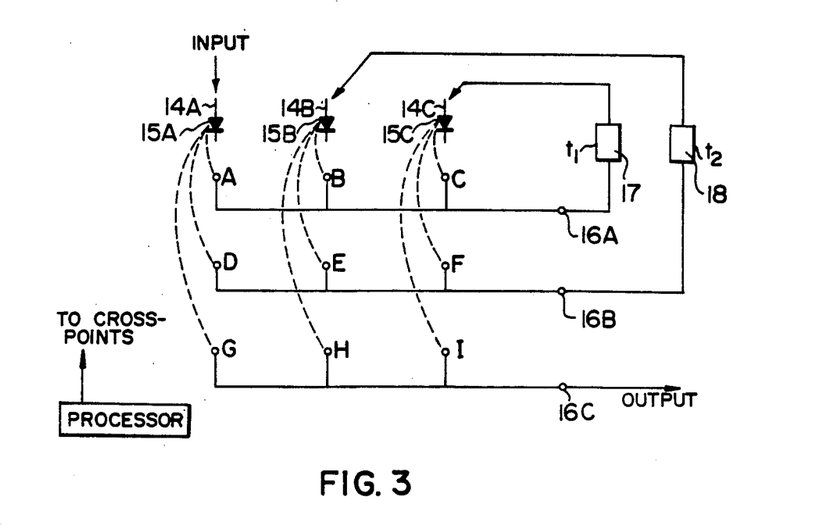
FIG. 3 is a schematic diagram of a first embodiment of the invention.

FIG. 3 shows the matrix of FIG. 2 schematically.

Three input ports 14A, 14B and 14C are connected to light-emitting diodes 15A, 15B and 15C respectively. Light-emitting diode 15A can be coupled to output ports 16A, 16B and 16C respectively via crosspoints A, D and G. Similarly light-emitting diode 15B can be coupled to output terminals 16A, 16B and 16C via crosspoints B, E and H. Light-emitting diode 15C can be coupled to output ports 16A, 16B and 16C through crosspoints C, F and I respectively.

When crosspoint G is closed by means of the application of bias which renders it photosensitive, and an input signal is applied at input terminal 14A, an output signal is received at output port 16C.

Output port 16A is coupled via signal delay apparatus 17, which has a time delay $t_1$, to input port 14C. Output port 16B is coupled to input port 14B via signal delay apparatus 18 which has a time delay $t_2$. It may be seen that the input signal can be applied to output port 16A by closing crosspoint A, which signal passes through delay apparatus 17 and is applied to input port 14C. By closure of crosspoint I, the delay signal can be applied to output port 16C. By switching crosspoints I and G at appropriate times, an appropriate signal can be obtained which is a digital phase modulation of the input signal.

The input signal can also be applied to output port 16B by closure of crosspoint D. The signal passes through delay apparatus 18, which can delay the signal a second, longer or shorter period of time than the delay apparatus 17. This delay signal appears at input port 14B and can be coupled to output port 16C by closure of crosspoint H. Thus no delay, a delay of $t_1$ or a delay $t_2$ can be obtained at port 16C by closure of crosspoints G, H or I at appropriate times.

While delays of time $t_1$ and $t_2$ can be different as described above, they could alternatively be the same, and the delays could be made additive, for example closing crosspoint A, F and H circulates the input signal from input port 14A via crosspoint A, output port 16A, time delay apparatus 17, crosspoint F, output port 16B, time delay apparatus 18, input port 14B, crosspoint H to the output port 16C. Thus selective time delays can be obtained by closure of the appropriate crosspoints at the desired times.

It is evident that the switching matrix can be employed to generate any delay that can be obtained by combining the delays $t_1$ and $t_2$. The switching matrix permits the input signal to be directed back to the input port side of the matrix via any delay apparatus or combination of them.

If each successive delay line is twice as long as the preceding, then a matrix of N by N crosspoints which has a set of N−1 delay lines can form a combination set of $2^{N-1}$ delays (including no delay). In practical terms, if N=7, 64 delays are provided. A 7 by 7 optoelectronic matrix switch is commercially available at present, sold under type number HOSW 009 by FOundation Instruments Ltd., 1794 Courtwood Crescent, Ottawa, Ontario.

The circulation of the signal through a delay line and addition of delay signals to the input produces a comb filtering action, where the separation and frequency of the passbands of the filter is the inverse of the delay time of the loops. In a manner similar to the production of $2^{N-1}$ delay described above, it is clearly possible to produce $2^{N-1}-1$ different comb filters using an N by N crosspoint matrix, and thus to make a discretely tunable comb filter.

Synthesis of more complex filters is also possible, since the recirculating groups can be combined in parallel by the switch matrix, yielding $2^{N-1}-N$ synthesized filters giving a total of $2^{N}-N-1$ filters of all kinds.

As described with reference to the delay generation above, it is possible to obtain N−1 discrete, different delays with an N by N matrix, excluding combinations of delay lines. If the delay lines have linearly, rather than exponentially related lengths, then it is possible to produce from a single input pulse, any combination of N−1 equi-spaced pulses following it. As a trivial but representative example, with a single input pulse at input port 14A and closure of crosspoints A, D, I and H, two timed spaced pulses will appear at output ports 16C, the relative times being dependent on the delays in delay apparatus 17 and 18. If a programmed microprocessor switches either or both crosspoints I and H, a binary two-bit word is produced from a single input pulse at input port 14A. The resultant output signal could also be produced by closure of switches A, F, H and I, which will recirculate an input pulse through delay apparatus 17 (which provides the first input pulse), a divided pulse of which also circulates through delay apparatus 18, which appears at output port 16C through crosspoint H. It will now become evident that there are several ways of programmably producing digital output words from a single input pulse.

Thus by configuring the switching matrix appropriately, any digital word of length N can be generated, and a driving pulse can be eliminated if required. Since optoelectronic matrix switches can be reconfigured at very high rates (the crosspoint can have sub-nanosecond switching times), high rate word generation can be performed. Also since the reconfiguration rate need only be 1/N of the output pulse rate, the pulse rate of the output signal is limited by the very wide bandwidth of the matrix switch and amplifiers, and not by the properties of the digital driving circuits. Optoelectronic matrix switches with passbands of several gigahertz have been demonstrated.

A high rate data signal can be monitored for the occurrence of a particular N-bit word. If the time interval between the delay lines is equal to the period of the incoming pulse stream, then a high level signal at output port 16C is obtained when coincidence of delayed pulses is obtained by the delay causing the pulses to be coincidently additive. Thus a digital matched filter is obtained.

It should be noted that the optical-to-electronic conversion at the crosspoints imposes a directionality that provides a feature which would not be available in a purely electronic switching matrix. The directionality permits recirculation of the signal in the delay loops, so that one or more ring resonators can be constructed. For example, closing crosspoints A, C and I causes recirculation through delay apparatus 17 and output at port 16C. The delay in the loop can have any of the $2^{N-1}$ values of the delay available.

Furthermore, ring resonators can be combined in parallel to create complex filter responses. A ring resonator is described in the article "FILTER RESPONSE OF SINGLE MODE FIBER RECIRCULATING DELAY LINES" by J. E. Bowers et al, Electronic Letters 18 PP110-111, 1982.

The ring resonators according to the embodiments described so far are hybrid devices employing the equivalent of an electronic repeater stage in the ring, which will degrade the dynamic range and noise performance in comparison with an all-optical loop. However the repeater gives control over the loop loss, and hence control over the Q value of the resulting filter. Furthermore, the ease and speed by which the loop lengths can be altered by the switching matrix are believed to give very significant advantages by permitting rapid tuning.

Two different experimental prototypes will be described. The first used LED light sources and pin photodiode crosspoints. The matrix had a passband of from 0 to 100 MHz, an insertion loss of 0 dB and switching time in the order of microseconds. The two delay connections between the output ports and the input ports through delay apparatus, that is, the reflex connections, were provided by 3 meter and 4.5 meter lengths of coaxial cable. The resulting observed dynamic range was about 25 dB and the Q was about 50 at a frequency of 80 MHz. Similar results were obtained for other loop lengths and switching configurations, including both the serial and parallel combination of the two ring resonator loops.

The second configuration utilizes fast laser diode light sources and detectors, which exhibited a passband from 300 MHz to above 1 Gigahertz, the upper limit being set by the responses of the laser sources. The insertion loss of this device, which did not include an output amplifier was about 30 dB. The delay reflex connection was provided by optical fiber. A 26 DB loop amplifier was included to make up the insertion loss of the laser-photoconductor combination. The properties of this tunable filter were found to be similar of those of a fixed hybrid filter employing an optical delay line. The filter envelope extended to above 1 Gigahertz. The Q measured at 600 MHz was about 300. The dynamic range was about 25 dB, apparently due to the dynamic range limitations of associated electronic circuits. The upper limit of dynamic range appears to be set by saturation in the photoconductive detector, the lower limit by amplifier noise. It is believed that improvement in the above will be obtained by use of improved detectors or amplifiers.

Figure 4:
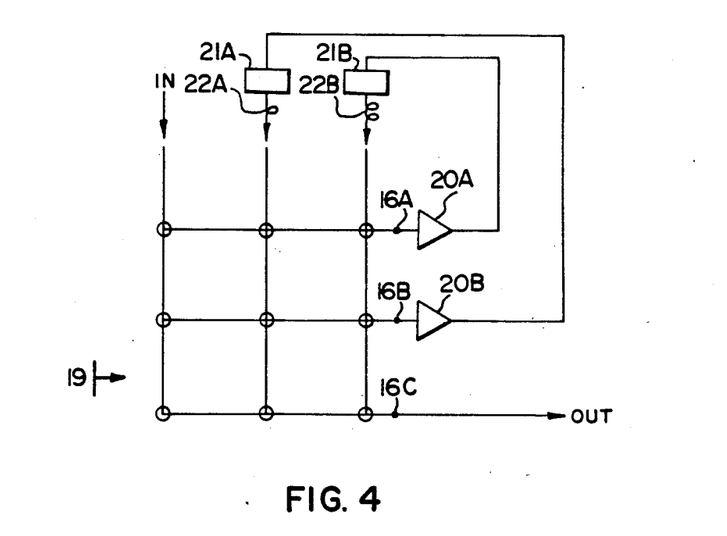
FIG. 4 is a schematic diagram of a second embodiment of the invention.

Clearly the delay apparatus can be delay lines realized either electrically or optically. FIG. 4 shows a representative circuit utilizing a 3×3 matrix 19, and optical fiber delay lines.

In this embodiment, output ports 16A and 16B feed signals appearing thereat to amplifiers 20A and 20B respectively, the outputs of which are connected to light-emitting diodes, semiconductor lasers, or the like, light sources 21A and 21B respectively. The resulting modulated light is coupled from the light sources 21A and 21B into an optical power dividing network (not shown) via optical waveguide delay lines 22A and 22B. The delay lines can be multimode waveguides similar to those used in the optical distribution system with the matrix, since most delays of interest involve short lengths of waveguides that will not cause significant dispersion.

It should be noted that an advantage of the optical-electrical-optical conversion noted above that may partly offset its disadvantage in the recirculating configurations is that it eliminates any possibility of concatenation of dispersion with recirculation around the loops.

It is of course possible to use electrical delay lines in the loops, whereby rather than using optical delay lines 22A and 22B, the coupling between the amplifiers 20A and 20B to light sources 21A and 22B are lengths of coaxial cable of such length as to provide the required time delay. The compactness and accuracy of the optical delay line, however, makes it the preferred embodiment.

It should be noted that the amplifiers 20A and 20B can be eliminated if the product of the slope of the power verses current characteristics of each of the laser light sources 21A and 21B and the responsivity of the associated crosspoint photodetector is about unity.

As a physical example, the slope of the output power characteristic of a Mitsubishi type ML-5308 laser is 0.35 W/A. The responsivity of a GaAs FET photoconductor was measured to be approximately 1.5 A/W at 1 Gigahertz. With the three-way power division required for a 3×3 matrix, the responsivity/power product is approximately 0.2, which appears to imply a loop loss of 13 dB in an ideal system.

A detection gain of the order of 35 dB appears to be obtainable with avalanche photodiode. Thus matrix switches employing avalanche photodiodes appear not to require loop gain to function effectively. In addition, the two-dimensional electron-gas FET, the Camel diode, the graded-gap phototransistor, and the avalanche phototransistor all have gain and may be suitable for use as optoelectronic crosspoint switching photodetectors.

Figure 5:
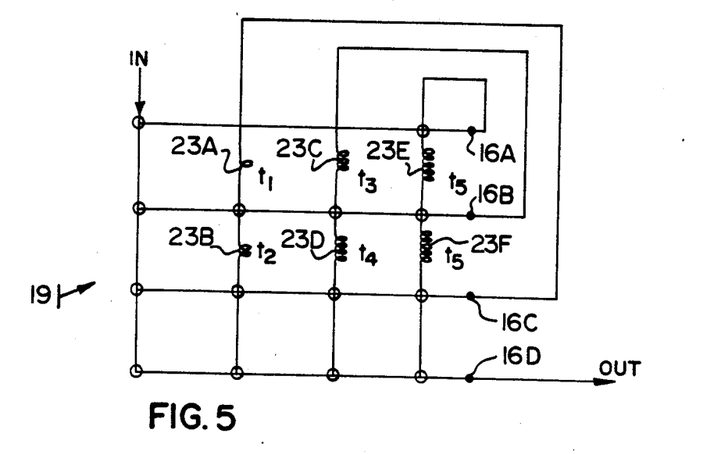
FIGS. 5 and 6 are schematic diagrams of other embodiments of the invention.

FIG. 5 is a schematic diagram of a further embodiment of the invention. A 4×4 matrix is shown, in which each of the output ports except the last (16D) is connected to an input port. The power splitter described earlier incorporates successively increasing delay time optical delay lines 23A-23F, which has delayed times T1-T6. Programmable delays, loop resonances, etc. as described earlier can be achieved by selective closing of the various crosspoints to obtain the desired delay lines as described earlier.

Figure 6:
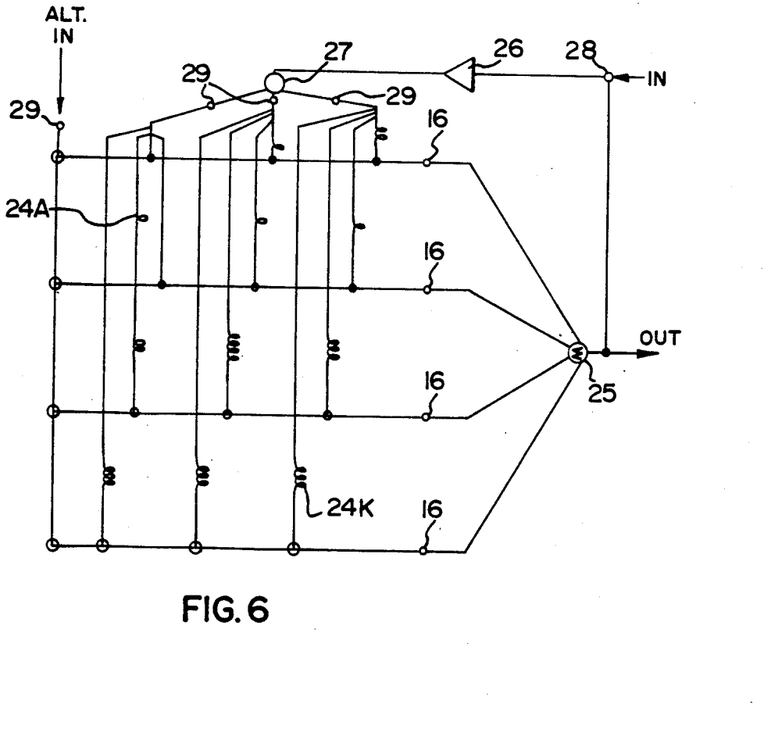

FIG. 6 is a schematic of another embodiment of the invention. In this case the dividers each incorporate different time delay delay lines 24A-24K. The output ports 16 are connected to a summer 25, the output of which provides an output signal. A reflex loop return is applied via amplifier 26, which has its output connected to one or a plurality of optical sources 27 which feed delay lines 24A-24K. An input signal can be received at point 28, or at one of the input ports 29 labelled ALT 1N, for example. As described earlier, the various crosspoints can be switched to provide various delay or loop arrangements in order to obtain the delay, data word generation, filter characteristics, etc. as required.

The invention described above clearly can be used as a variable delay generator for such wideband signals as are encountered in radar antenna phasing, etc. Since certain optoelectronic switches can be switched very rapidly, the delays can be altered quickly. As noted above, GaAs photoconductor optoelectronic crosspoint switches have been noted to having switching times of less than 1 nanosecond. Thus the present invention is expected to be useful in high-speed digital multiplexing and word generation.

Concerning the ring resonator application, the ease and speed by which the loop length can be altered by the switching matrix can give very significant advantages by permitting rapid tuning, as required in frequency hopping transmission systems.

Also as noted earlier, a high-rate multiplexer or word generator can be provided using the present invention. For an N×N matrix which has N−1 discrete delay lines with linearly related lengths it is possible to produce from a single input pulse any combination of N−1 equi-spaced pulses following it. Thus, by an appropriate configuration of the switching matrix, any digital word of length N can be generated and the driving pulse can be eliminated if required. Since the crosspoints can have sub-nanosecond switching time, very high rate word pattern generation can be obtained. Furthermore, since the matrix reconfiguration rate need only be 1/N of the output pulse rate, the latter will be limited by the bandwidth of the matrix and not by the properties of the external digital driving circuits.

The present invention can be used as a correlator or matched filter for optimizing signal to noise ratio in digital signal processing. This is done by prebiasing the crosspoint matrix such that upon arrival of the desired signal, a maximum input response will be detected at the output. Thus adaptive matched filtering application can be achieved by real-time programming the biased configuration to allow for different signal identification or other changing conditions.

The feasibility of using wide band reflex optoelectronic switching matrixes thus can generate discretely programmable precise delays and discretely tunable comb filters of good dynamic range and Q. Complex filter responses can be realized as well by making use of serial and parallel combinations of delay. Various signal processing functions can be performed and can be programmed at a very high rate. Thus it is believed that the invention will be useful for application in processing analog-to-digital signals.

A person understanding this invention may now conceive of various embodiments or alternative designs using the principals described herein. All are considered to be within the scope of the invention as defined in the claims appended hereto.

We claim:
1. A signal processor comprising:
 (a) an optoelectronic switching matrix having a plurality of input ports and a plurality of output ports, and an array of switched crosspoints interconnecting said ports,
 (b) means for receiving an input signal at a first input port,
 (c) a signal delay means individually connecting all but one output port to all but said first input port,
 (d) the matrix including means for selectively switching said first input port to said one output port to provide a representation of the input signal at said one output port, or for switching said first input port to an other output port and switching an other input port to which said other output port is connected via a signal delay means to said one output port to provide a delayed representation of the input signal, at said one output port.

2. A signal processor as defined in claim 1, in which each of the crosspoints is unidirectional, the switching matrix including means for switching said other input port to the said other output port, whereby a ring resonator is formed utilizing the delay of the signal delay means.

3. A signal processor cosprising:
 (a) an optoelectronic switching matrix having at least first and second input ports and at least first and second output ports, and an array of switched crosspoints interconnecting said ports,
 (b) means for receiving an input signal at the first input port,
 (c) a first signal delay means connected between the first output port and the second input port,
 (d) the matrix including means for selectively switching the first input port to the second output port to provide a representation of the input signal at the second output port, or for switching the first input port to the first output port and switching the second input to the second output port to provide a delayed representation of the input signal at the second output port,
 (e) the matrix further including a plurality of input ports and a plurality of output ports,
 (f) a plurality of signal delay means each connecting one of the plurality of output ports to one of the plurality of input ports,
 (g) the matrix including means for selectively switching any of the input ports to any of the output ports thereby selectively passing an input signal through any one or more of the delay means to provide a selectively delayed signal at a predetermined output port.

4. A signal processor as defined in claim 3, in which the time delay of each successive signal delay means is twice as long as a preceding signal delay means.

5. A signal processor as defined in claim 3, in which each of the crosspoints is unidirectional, the switching matrix including means for selectively switching predetermined signal delay means serially into a loop, whereby a ring resonator of selectable time delay is formed.

6. A signal processor as defined in claim 3 in which the switching matrix is comprised of an optical signal transmission path coupled to each input port, an optical power divider coupled to each optical signal transmission path for splitting an optical signal carried by a corresponding input port into divided optical signals each corresponding to an output port, means coupling one divided optical signal from each of the dividers to each of the output ports, and means for selectively enabling and disabling any of the coupling means, whereby any of the divided optical signals can be selectively coupled to any of the output ports.

7. A signal processor as defined in claim 3 in which the switching matrix is comprised of an optical signal transmission path coupled to each input port, an optical power divider coupled to each said optical signal transmission path for splitting an optical signal carried by a corresponding input port into divided optical signals each corresponding to an output port, means coupling one divided optical signal from each of the dividers to each of the output ports, and voltage bias means for selectively enbling and disabling any of the coupling means, whereby any of the divided optical signals can be selectively coupled to any of the output ports.

8. A signal processor as defined in claim 3 in which the switching matrix is comprised of an optical signal transmission path coupled to each input port, an optical power divider coupled to each optical signal transmission path for splitting an optical signal carried by a corresponding input port into divided optical signals each corresponding to an output port, each divider constituting said delay means, means coupling one divided optical signal from each of the dividers to each of the output ports, and means for selectively enabling and disabling any of the coupling means, whereby any of the divided optical signals can be selectively coupled to any of the output ports.

9. A signal processor as defined in claim 3 in which the signal delay means is comprised of an electronic signal delay apparatus.

10. A signal processor as defined in claim 3 in which the signal delay means is comprised of an optical delay apparatus.

11. A signal processor as defined in claim 3 in which the signal delay means is comprised of an electronic signal amplifier, a light source connected to the output of the amplifier for being driven thereby, and an optical waveguide delay line in a transmission path between the light source and an input port of said matrix.

12. A signal processor as defined in claim 3, in which each of the crosspoints is unidirectional, the switching matrix including means for switching the second input port to the first output port, whereby a ring resonator is formed utilizing the delay of the first original delay means.

13. A signal processor as defiqed in claim 3, in which each of the delay means has a different delay time than the other delay means.

14. A signal processor as defined in claim 13, in which each of the crosspoints is unidirectional, the switching matrix including means for switching each signal delay means into a loop, each forming a ring resonator, whereby a filter is formed.

15. A signal processor as defined in claim 13 in which the time delay of successive signal delay means is linearly related to a preceding signal delay means, means for providing an input pulse at the first input port, the switching matrix including means for switching the pulse via predetermined ones of the delay means to an output port to provide a digital word at the latter output port.

16. A signal processor as defined in claim 13, in which the switching matrix includes means for switching predetermined ones of the output ports to predetermined ones of the input ports via the signal delay means, means for providing a signal to the input port, and means for providing a maximum impulse response signal at an output port depending on the matching of the switched configuration of the switching matrix.

17. A signal processor as defined in claim 13, in which each of the crosspoints is unidirectional, the switching matrix including means for switching the second input port to the first output port, whereby a ring resonator is formed utilizing the delay of the first original delay means.

18. A signal processor as defined in claim 13, in which the time d®lay of each successive signal delay means is twice as long as a preceding signal delay means.

19. A signal processor as defined in claim 13, in which each of the crosspoints is unidirectional, the switching matrix including means for selectively switching predetermined signal delay means serially into a loop, whereby a ring resonator of selectable time delay is formed.

20. A signal processor as defined in claim 13 in which the switching matrix is comprised of an optical carrier connected to each input port, an optical power divider coupled to each optical carrier for splitting an optical signal carried by a corresponding input port into divided optical signals each corresponding to an output port, means coupling one divided optical signal from each of the dividers to each of the output ports, and means for selectively enabling and disabling any of the coupling means, whereby any of the divided optical signals can be selectively coupled to any of the output ports.

21. A signal processor as defined in claim 13 in which the switching matrix is comprised of an optical carrier connected to each input port, an optical power divider coupled to each optical carrier for splitting an optical signal carried by a corresponding input port into divided optical signals each corresponding to an output port, means coupling one divided optical signal from each of the dividers to each of the output ports, and voltage bias means for selectively enabling and disabling any of the coupling means, whereby any of the divided optical signals can be selectively coupled to any of the output ports.

22. A signal processor as defined in claim 13 in which the switching matrix is comprised of an optical carrier connected to each input port, an optical power divider coupled to each optical carrier for splitting an optical signal carried by a corresponding input port into divided optical signals each corresponding to an output port, each divider constituting said delay means, means coupling one divided optical signal from each of the dividers to each of the output ports, and means for selectively enabling and disabling any of the coupling means, whereby any of the divided optical signals can be selectively coupled to any of the output ports.

23. A signal processor as defined in claim 13 in which the signal delay means is comprised of an electronic signal delay apparatus.

24. A signal processor as defined in claim 13 in which the signal delay means is comprised of an optical delay apparatus.

25. A signal processor as defined in claim 13 in which the signal delay means is comprised of an electronic signal amplifier, a light source connected to the output of the amplifier for being driven thereby, and an optical waveguide delay line in a transmission path between the light source and an input port of said matrix.

26. A signal processor as defined in claim 13, in which each of the crosspoints is unidirectional, the switching matrix including means for selectively switching one or more signal delay means serially or in parallel into one or more loops of different delay times, each loop forming a ring resonator, whereby a switchable filter is formed.

27. A signal processor as defined in claim 26, in which the time delay of each successive signal delay means is twice as long as a preceding signal delay means.

28. A signal processor as defined in claim 13, in which each of the crosspoints is unidirectinal, the switching matrix including means for selectively switching one or more signal delay means into separate loops each forming a ring resonator, and for switching the separate loops in parallel to an output port, whereby a filter is formed.

29. A signal processor as defined in claim 28 in which the time delay of each signal delay means is different from another, selective switching thereof providing a tunable filter.

30. A signal processor as defined in claim 28 in which each signal delay means is comprised of an optical waveguide, the time delay of each being different from another, selective switching thereof providing a comb filter having an envelope extending to at least 1 Gigahertz.

31. A signal processor comprising an optoelectronic switching matrix having switching crosspoints, a plurality of input ports, a plurality of output ports, and means for switching different signal delay means between all but one of the input ports and all but one of the output ports via the switching matrix.

32. A signal processor as defined in clam 31 including individual feedback circuit paths connected between all but said one of the output ports and all but one of the input ports.

33. A signal processor as defined in claim 31 in which each of the crosspoints is unidirectional, the switching means including means for switching a signal delay means in a loop whereby a ring resonator is formed.

34. A signal processor as defined in claim 32 in which each of the crosspoints is unidirectional, the switching means including means for switching a signal delay means in a loop whereby a ring resonator is formed.

35. A signal processor comprising an optoelectronic switching matrix, an input port, an output port, the matrix including a plurality of inputs in communication with said input port via respective signal delay means to crosspoints of said matrix, the having a plurality of outputs in communication with the output port, and means for switching any of said signal delay means between the input port and the ouput port via the switching matrix.

36. A signal processor as defined in claim 35 in which each of the crosspoints is unidirectional, the switching matrix including means for switching each signal delay means into a loop, each forming a ring resonator, whereby a filter is formed.

37. A signal processor as defined in claim 35 in which each of the crosspoints is unidirectional, the switching matrix including means for selectively switching one or more signal delay means serially or in parallel into one or more loops having different delay times, each loop forming a ring resonator, whereby a switchable response filter is formed.

38. A signal processor as defined in claim 35 in which the time delay of each successive signal delay means is twice as long as the time delay of a preceding signal delay means.

39. A signal processor as defined in claim 35 in which each of the crosspoints is unidirectional, the switching matrix including means for selectively switching predetermined signal delay means serially into a loop, whereby a ring resonator of selectable time delay is formed.

40. A signal processor as defined in claim 35 in which each of the crosspoints is unidirectional, the switching matrix includes means for selectively switching one or more signal delay means ihto separate loops each forming a ring resonator, and for switching the separate loops in parallel to an output port, whereby a filter is formed.

41. A signal processor as defined in claim 35 in which the time delay of each signal delay means is different from another, selective switching thereof providing a tunable filter.

42. A signal processor as defined in claim 35 in which each signal delay means is comprised of an optical fiber, the time delay of each being different from another, selective switching thereof providing a comb filter having an envelope extending to at least 1 Gigahertz.

43. A signal processor as defined in claim 35 in which the time delay of successive signal delay means is linearly related to a preceding signal delay means, means for providing an input pulse at the first input port, the switching matrix including means for switching the pulse via predetermined ones of the delay means to an output port to provide a digital word at the latter output port.

44. A signal processor as defined in claim 35 in which the switching matrix includes means for switching predetermined ones of the output ports to predetermined ones of the input ports via the signal delay means, means for providing a signal to the input port, and means for providing a maximum impulse response signal at an output port depending on the matching of the switched configuration of the switching matrix.

45. A signal processor as defined in claim 35 in which the switching matrix is comprised of an optical carrier connected to each input port, an optical power divider coupled to each optical carrier for splitting an optical signal carried by a corresponding input port into divided optical signals each corresponding to an output port, means coupling one divided optical signal from each of the dividers to each of the output ports, and means for selectively enabling and disabling any of the coupling means, whereby any of the divided optical signals can be selectively coupled to any of the output ports.

46. A signal processor as defined in claim 35 in which the switching matrix is comprised of an optical carrier connected to each input port, an optical power divider coupled to each optical carrier for splitting an optical signal carried by a corresponding input port into divided optical signals each corresponding to an output port, means coupling one divided optical signal from each of the dividers to each of the output ports, and voltage bias means for selectively enabling and disabling any of the coupling means, whereby any of the divided optical signals can be selectively coupled to any of the output ports.

47. A signal processor as defined in claim 35 in which the switching matrix is comprised of an optical carrier connected to each input port, an optical power divider coupled to each optical carrier for splitting an optical signal carried by a corresponding input port into divided optical signals each corresponding to an output port, each divider constituting said delay means, means coupling one divided optical signal from each of the dividers to each of the output ports, and means for selectively enabling and disabling any of the coupling means, whereby any of the divided optical signals can be selectively coupled to any of the output ports.

48. A signal processor as defined in claim 35 in which the signal delay means is comprised of an electronic signal delay apparatus.

49. A signal processor as defined in claim 35 in which the signal delay means is comprised of an optical delay apparatus.

50. A signal processor as defined in claim 35 in which the signal delay means is comprised of an electronic signal amplifier, a light source connected to the output of the amplifier for being driven thereby, and an optical waveguide delay line in a transmission path between the light source and an input port of said matrix.

51. A signal processor as defined in claim 35, including a feedback circuit path connected between the output port and the input port.

52. A signal processor as defined in claim 51 in which the input port is provided for receiving a feedback signal from the feedback circuit path, and further including a main input port for carrying an external input signla to said matrix.

53. A signal processor comprising an optoelectronic switching matrix, an input port, an output port, the matrix including a plurality of inputs and a plurality of outputs, each output being connected to a corresponding input, excepting one input and one output, each input being switchable to an output via a signal delay means, theinput port being connected to said one input, and the output port being connected to said one output, whereby a signal applied to the input port is switchable via any of the signal delay means to the output port.

54. A signal processor as defined in claim 53 in which each of the crosspoints is unidirectional, the switching means including means for switching a signal delay means in a loop whereby a ring resonator is formed.

55. A signal processor as defined in claim 53, the matrix including an array of crosspoints, in which each of the crosspoints is unidirectional, the switching matrix including means for switching each signal delay means into a loop, each forming a ring resonator, whereby a filter is formed.

56. A signal processor as defined in claim 53, the matrix including an array of crosspoints, in which each of the crosspoints is unidirectional, the switching matrix including means for selectively switching one or more signal delay means serially or in parallel into one or more loops having different delay times, each loop forming a ring resonator, whereby a switchable response filter is formed.

57. A signal processor as defined in claim 53 in which thetime delay of each successive signal delay means is twice as long as the time delay of a preceding signal delay means.

58. A signal processor as defined in claim 53, the matrix including an array of crosspoints, in which each of the crosspoints is unidirectional, the switching matrix including means for selectively switching predetermined signal delay means serially into a loop, whereby a ring resonator of selectable time delay is formed.

59. A signal processor as defined in claim 53, the matrix including an array of crosspoints, in which each of the crosspoints is unidirectional, the switching matrix includes means for selectively switching one or more signal delay means into separate loops each forming a ring resonator, and for switching the separate loops in parellel to an output port, whereby a filter is formed.

60. A signal processor as defined in claim 53 in which the time delay of each signal delay means is different from another, selective switching thereof providing a tunable filter.

61. A signal processor as defined in claim 53 in which each signal delay means is comprised of an optical fiber, the time delay of each being different from another, selective switching thereof providing a comb filter having an envelope extending to at least 1 Gigahertz.

62. A signal processor as defined in claim 53 in which the time delay of successive signal delay means is linearly related to a preceding signal delay means, means for providing an input pulse at the first input port, the switching matrix including means for switching the pulse via predetermined ones of the delay means to an output port to provide a digital word at the latter output port.

63. A signal processor as defined in claim 53 in which the switching matrix includes means for switching predetermined ones of the output ports to predetermined ones of the input ports via the signal delay means, means for providing a signal to the input port, and means for providing a maximum impulse response signal at an output port depending on the matching of the switched configuration of the switching matrix.

* * * * *